United States Patent

Nasu

[11] Patent Number: 5,875,194
[45] Date of Patent: Feb. 23, 1999

[54] REPAIRING EFFICIENCY BY GRAY CODE

[75] Inventor: Takumi Nasu, Tsuchiura, Japan

[73] Assignee: Texas Instruments Incorporated, Dallas, Tex.

[21] Appl. No.: 69,042

[22] Filed: May 28, 1993

[30] Foreign Application Priority Data

May 28, 1992 [JP] Japan ................................ 4-162243

[51] Int. Cl.$^6$ .................................................. G06F 11/00
[52] U.S. Cl. .......................................................... 371/10.2
[58] Field of Search ...................... 364/245.3; 365/200, 365/230.05, 230.03, 189.04, 189.01; 371/10.1, 10.2, 10.3, 11.1; 395/575, 182.04, 182.05

[56] References Cited

U.S. PATENT DOCUMENTS

| | | | |
|---|---|---|---|
| 4,783,781 | 11/1988 | Awaya | 371/10.1 |
| 5,021,944 | 6/1991 | Sasaki et al. | 365/200 |
| 5,289,428 | 2/1994 | Sato et al. | 365/230.05 |
| 5,313,423 | 5/1994 | Sato et al. | 365/200 |
| 5,325,333 | 6/1994 | Sato | 365/200 |
| 5,325,334 | 6/1994 | Rob et al. | 365/201 |
| 5,327,381 | 7/1994 | Johnson et al. | 365/200 |

FOREIGN PATENT DOCUMENTS

| | | | |
|---|---|---|---|
| 2198100 | 8/1990 | Japan | G11C 29/00 |
| 2210686 | 8/1990 | Japan | G11C 11/401 |

*Primary Examiner*—Albert DeCady
*Attorney, Agent, or Firm*—Dana L. Burton; William B. Kempler; Richard L. Donaldson

[57] ABSTRACT

Objective: To make it possible to easily increase the integration level and increase the memory capacity of a semiconductor memory device by using a single redundant decoder to completely repair defects at one or two neighboring addresses. Structure: The redundant circuit of the present invention comprises the following: an address code conversion circuit (2) which converts address signals, inputted in binary code, into gray code; a decoder (3) which outputs a coincidence signal after determining whether the addresses set in advance coincide or do not coincide with the gray code outputted from the aforementioned address code conversion circuit; a first driver (DR2) which drives a first redundant line which is connected to a redundant memory cell designed to supplement memory cells in which defects have occurred; and a second driver (DR1) which drives a second redundant line. Either the first driver or the second driver (DR1 or DR2), which respectively drive the first and second redundant lines, is selected according to the coincidence signal outputted from the aforementioned decoder (3), the least significant bit in the aforementioned binary code address signal, and the corresponding complemented signal. Defects at one or two neighboring addresses are thus repaired using a single decoder.

9 Claims, 7 Drawing Sheets

FIG. 2A

| BINARY CODE ADDRESS | | | GRAY CODE | | | | | | | | |
|---|---|---|---|---|---|---|---|---|---|---|---|
| B2 | B1 | B0 | G2 | G1 | G0 | F5 | F4 | F3 | F2 | F1 | F0 |
| 0 | 0 | 0 | 0 | 0 | 0 | 0 | – | 0 | – | 0 | – |
| 0 | 0 | 1 | 0 | 0 | 1 | 0 | – | 0 | – | – | 0 |
| 0 | 1 | 0 | 0 | 1 | 1 | 0 | – | – | 0 | – | 0 |
| 0 | 1 | 1 | 0 | 1 | 0 | 0 | – | – | 0 | 0 | – |
| 1 | 0 | 0 | 1 | 1 | 0 | – | 0 | – | 0 | 0 | 0 |
| 1 | 0 | 1 | 1 | 1 | 1 | – | 0 | – | 0 | – | 0 |
| 1 | 1 | 0 | 1 | 0 | 1 | – | 0 | 0 | – | – | 0 |
| 1 | 1 | 1 | 1 | 0 | 0 | – | 0 | 0 | – | 0 | – |

FIG. 2B

| BINARY CODE ADDRESS | | | GRAY CODE | | | | | | | | |
|---|---|---|---|---|---|---|---|---|---|---|---|
| B2 | B1 | B0 | G2 | G1 | G0 | F5 | F4 | F3 | F2 | F1 | F0 |
| 0 | 0 | 0 | 0 | 0 | 0 | | | | | | |
| 0 | 0 | 1 | 0 | 0 | 1 | 0 | – | 0 | – | 0 | 0 |
| 0 | 0 | 1 | 0 | 0 | 1 | | | | | | |
| 0 | 1 | 0 | 0 | 1 | 1 | 0 | – | 0 | 0 | – | 0 |
| 0 | 1 | 0 | 0 | 1 | 1 | | | | | | |
| 0 | 1 | 1 | 0 | 1 | 0 | 0 | – | – | 0 | 0 | 0 |
| 0 | 1 | 1 | 0 | 1 | 0 | | | | | | |
| 1 | 0 | 0 | 1 | 1 | 0 | 0 | 0 | – | 0 | 0 | – |
| 1 | 0 | 0 | 1 | 1 | 0 | | | | | | |
| 1 | 0 | 1 | 1 | 1 | 1 | – | 0 | – | 0 | 0 | 0 |
| 1 | 0 | 1 | 1 | 1 | 1 | | | | | | |
| 1 | 1 | 0 | 1 | 0 | 1 | – | 0 | 0 | 0 | – | 0 |
| 1 | 1 | 0 | 1 | 0 | 1 | | | | | | |
| 1 | 1 | 1 | 1 | 0 | 0 | – | 0 | 0 | – | 0 | 0 |

REF.2 brackets rows (0 1 0) and (0 1 1). AND operations shown between consecutive row pairs.

FIG. 4

| | | | | | | | | | | | | | | | | | | | | | | | |
|---|---|---|---|---|---|---|---|---|---|---|---|---|---|---|---|---|---|---|---|---|---|---|---|
| | B0 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| | B1 | 0 | 0 | 1 | 1 | 0 | 0 | 1 | 1 | 0 | 0 | 1 | 1 | 0 | 0 | 1 | 1 | 0 | 0 | 1 | 1 | 1 | 1 |
| | B2 | 0 | 0 | 0 | 0 | 1 | 1 | 1 | 1 | 0 | 0 | 0 | 0 | 1 | 1 | 1 | 1 | 0 | 0 | 0 | 0 | 1 | 1 |
| | B3 | 0 | 0 | 0 | 0 | 0 | 0 | 0 | 0 | 1 | 1 | 1 | 1 | 1 | 1 | 1 | 1 | 0 | 0 | 0 | 0 | 1 | 1 |
| | B4 | 0 | 0 | 0 | 0 | 0 | 0 | 0 | 0 | 0 | 0 | 0 | 0 | 0 | 0 | 0 | 0 | 1 | 1 | 1 | 1 | 1 | 1 |
| BINARY | B5 | 0 | 0 | 0 | 0 | 0 | 0 | 0 | 0 | 0 | 0 | 0 | 0 | 0 | 0 | 0 | 0 | 0 | 0 | 0 | 0···1 | 1 |
| CODE | B6 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| ADDRESS | B7 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | B8 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | B9 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | B10 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | B11 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | B12 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| | G0 | 0 | 1 | 1 | 0 | 0 | 1 | 1 | 0 | 0 | 1 | 1 | 0 | 0 | 1 | 1 | 0 | 0 | 1 | 1 | 0 | 1 | 0 |
| | G1 | 0 | 0 | 1 | 1 | 1 | 1 | 0 | 0 | 0 | 0 | 1 | 1 | 1 | 1 | 0 | 0 | 0 | 0 | 1 | 1 | 0 | 0 |
| | G2 | 0 | 0 | 0 | 0 | 1 | 1 | 1 | 1 | 1 | 1 | 1 | 1 | 0 | 0 | 0 | 0 | 0 | 0 | 1 | 1 | 0 | 0 |
| | G3 | 0 | 0 | 0 | 0 | 0 | 0 | 0 | 1 | 1 | 1 | 1 | 1 | 1 | 1 | 1 | 1 | 1 | 1 | 1 | 1 | 0 | 0 |
| | G4 | 0 | 0 | 0 | 0 | 0 | 0 | 0 | 0 | 0 | 0 | 0 | 0 | 0 | 0 | 0 | 1 | 1 | 1 | 1 | 1 | 0 | 0 |
| GRAY | G5 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| CODE | G6 | 0 | 0 | 0 | 0 | 0 | 0 | 0 | 0 | 0 | 0 | 0 | 0 | 0 | 0 | 0 | 0 | 0 | 0 | 0 | 0···0 | 0 |
| | G7 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | G8 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | G9 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | G10 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | G11 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | G12 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |

FIG. 5A

BINARY
B4  0 0 0 0 0 0 0 0 0 0 0 0 0 0 1
B3  0 0 0 0 0 0 0 1 1 1 1 1 1 1 0
B2  0 0 0 0 1 1 1 0 0 0 0 1 1 1 0
B1  0 0 1 1 0 0 1 1 0 0 1 1 0 1 1 0
B0  0 1 0 1 0 1 0 1 0 1 0 1 0 1 0 1 0
     A   B       C           D       E

FIG. 5B

GRAY CODE        j   k   l   m   n   o   p
G4  0 0 0 0 0 0 0 0 0 0 0 0 0 0 0 1
G3  0 0 0 0 0 0 0 1 1 1 1 1 1 1 1
G2  0 0 0 0 1 1 1 1 1 1 1 0 0 0 0 0
G1  0 0 1 1 1 0 0 0 0 1 1 1 0 0 0
G0  0 1 1 0 0 1 1 0 0 1 1 0 0 1 1 0 0
     a   b   c   d   e   f   g   h

REPAIRING EFFICIENCY BY GRAY CODE

FIELD OF THE INVENTION

The present invention pertains to a semiconductor memory device with redundant circuitry, and pertains in particular to a semiconductor memory device having redundant circuitry in which a single decoder is used to repairing one or two neighboring addresses in which defects have occurred.

BACKGROUND OF THE INVENTION

Conventionally, semiconductor memory devices have been provided with spare memory cells or redundant memory cells in order to improve yield. When a defect occurs in an original memory cell, the aforementioned redundant memory cell can be used as a memory cell designed to repair the aforementioned memory cell with the defect.

This type of semiconductor memory device is equipped with components such as redundant memory cells and redundant circuitry used to select and activate the aforementioned redundant memory cells.

The aforementioned redundant memory cells are arranged in terms of two directions: the horizontal (ROW) direction and the vertical (COLUMN) direction. When the address of a defective memory cell is decoded by a redundant decoder, the original memory cell and the aforementioned redundant memory cell are switched according to the address, thereby repairing the defective memory cell.

FIG. 9 is a block diagram which shows the structure of a redundant circuit in a conventional semiconductor memory device. Address data (200), in binary code, is inputted via A0–A12 to the latch circuit (not shown) of an address buffer (51).

The latch circuit (not shown) of the aforementioned address buffer (51) outputs a binary code (201) through B0–B12 to redundant decoders (52, 52', and 52").

For example, the address of a defective cell to be repaired may first be programmed into the redundant decoder (52) by blowing a fuse of fuses. The aforementioned fuse is composed of polysilicon, etc., and occupies an area of nearly 14 $\mu$m (vertical) by 7 $\mu$m (horizontal).

The aforementioned redundant decoder (52) comprises a discriminator circuit (not shown), which serves to determine whether or not there is a coincidence between the address of the defective memory cell to be repaired, and the address corresponding to the binary code (201) outputted from the latch circuit (not shown) of the aforementioned address buffer (51).

The discriminator circuit (not shown) of the aforementioned redundant decoder (52) outputs a driver drive signal (202) to activate a redundant line driver (53) when the address of the cell to be repaired coincides with the address corresponding to the binary code (201).

When the aforementioned redundant line driver (53) is activated, the redundant line connected to a redundant memory cell (55) is driven. As a result, the normal row or normal column is replaced with the redundant line, thereby repairing the defective memory cell.

The discriminator circuit (not shown) of the aforementioned redundant decoder (52) does not output a driver drive signal (202) when the address of the defective memory cell to be repaired does not coincide with the address corresponding to the binary code (201). As a result, the redundant line driver (53) is not activated, and the redundant line is not driven.

The redundant decoder of the redundant circuit in the aforementioned type of semiconductor memory device is designed to set the address of the defective memory cell through the action of a fuse. Since a laser is used to blow the aforementioned fuse, it is necessary to install other circuits in addition to the redundant circuit, which is problematic in terms of "space margin" in that a considerably larger area is required for forming the redundant circuit.

In addition, this difficulty has become an even greater problem in recent years because the number of fuses has increased with the higher levels of integration now used in devices.

In relation to this, one conventional solution has been to reduce the number of fuses in the redundant circuit, thereby reducing the area in which the redundant circuit is formed, without improving the repairing efficiency of the defective memory cells in the semiconductor memory device.

As an example, the numbers of fuses used in the ROW redundant circuits of 4 MB DRAM and 16 MB DRAM will be discussed.

4 MB DRAM is designed to have 16 fuses per single redundant decoder, in 32 arrays, with 2 redundant ROWs for every 2 arrays. When the number of redundant lines and redundant decoders are designed to exist in a 2:1 ratio, 32 redundant decoders are required. Thus, the number of fuses required for a single chip is 512. As a result, the minimum amount of space required for forming the fuses will be $512\times(7\times14)$ $\mu$m$^2$.

In contrast, 16 MB DRAM is designed to have 12 fuses per single redundant decoder, in 64 arrays, with 4 redundant ROWs for each array. When the number of redundant lines and redundant decoders are designed to exist in a 2:1 ratio, 128 redundant decoders are required. Thus, the number of fuses required for a single chip is 1536. As a result, with a 16 MB DRAM, the minimum amount of space required for forming the fuses will be $1536\times(7\times14)$ $\mu$m$^2$. Thus, the space required for forming the redundant circuit is increased, which is problematic in that the size of the memory chip is increased.

In relation to this, the aforementioned semiconductor memory device is designed on the principle of flexible decoding, which is a method serving to reduce the number of redundant decoders.

For example, when flexible decoding is used with the aforementioned 16 MB DRAM, it is possible to reduce the number of redundant decoders from 128 to 12. Thus, it is possible to dramatically reduce the number of fuses on a single chip: from 1536 to 144.

However, with the aforementioned semiconductor memory device, since binary code is used in the discriminator circuit (serving to determine whether or not there is a match with the address of the redundant decoder), it has not been possible up to this point to develop redundant decoders which can be programmed so as to be capable of handling all cases of neighboring defective cells. Reasons for this include the fact that the corresponding circuitry is made more complex and that the size is increased excessively.

In relation to this, the present invention provides a redundant circuit which makes it possible, using a single redundant decoder, to repair defects generated at one or two neighboring addresses. It has the objective of making it possible to easily increase the integration level and increase memory capacity through reducing the number of fuses in the redundant circuit.

SUMMARY OF THE INVENTION

In order to solve the above problems, the first semiconductor memory device of the present invention is equipped with a redundant circuit which comprises the following: an address code conversion circuit which converts address signals, inputted in binary code, into gray code; a decoder, in which are set the addresses of one or two neighboring memory cells in which defects have occurred, outputs a coincidence signal after determining whether the addresses set in advance coincide or do not coincide with the gray code outputted from the aforementioned address code conversion circuit; a first driver, into which are inputted the aforementioned coincidence signal and the least significant bit of the aforementioned binary code address signal, drives a first redundant line, which is connected to a redundant memory cell designed to repair memory cells in which defects have occurred; and a second driver, into which are inputted the aforementioned coincidence signal and the complemented signal of the least significant bit of the aforementioned binary code address signal, drives a second redundant line, which is connected to a redundant memory cell designed to repair memory cells in which defects have occurred.

In addition, the second semiconductor memory device of the present invention is a semiconductor memory device, in which the memory address assignments are made according to the gray code order; wherein said semiconductor memory device is equipped with a redundant circuit which comprises the following: a decoder, in which are set the addresses of one or two neighboring memory cells in which defects have occurred, outputs a coincidence signal after determining whether the addresses set in advance coincide or do not coincide with the input address signal; an address code conversion circuit which converts input address signals into binary code; a first driver, into which are inputted the aforementioned coincidence signal and the least significant bit of the aforementioned binary-coded address signal, drives a first redundant line, which is connected to a redundant memory cell designed to repair memory cells in which defects have occurred; and a second driver, into which are inputted the aforementioned coincidence signal and the complemented signal of the least significant bit of the aforementioned binary-coded address signal, drives a second redundant line, which is connected to a redundant memory cell designed to repair memory cells in which defects have occurred.

With the aforementioned first semiconductor memory device, the process in the aforementioned decoder of setting the address at which a defect was occurred is activated by the blowing of a fuse composing part of a coincidence/un-coincidence discriminator circuit. In setting a single address, a fuse is blown in the same manner as in conventional structures, so as to allow the decoder to be activated only when that address is inputted. In this case, since the address signal inputted to the decoder is in gray code, the process of setting the address is conducted to correspond to gray code. In gray code, sequential numbers are represented by expressions that differ only in one bit. When that particular bit is ignored (the value of that particular bit may be either 0 or 1), and the fuse of the aforementioned decoder is blown, the aforementioned decoder will be activated after the input of either one of the two neighboring addresses.

Thus, the process of setting the neighboring two addresses involves the blowing of a fuse while ignoring the aforementioned gray code particular bit. Since the first and second drivers are connected to the aforementioned decoder, it is necessary to select one driver or the other in both cases (the case of correction at one address, and the case of correction at two neighboring addresses). Since the least significant bits of two sequential binary numbers are always the complement of each other, it is possible to select the aforementioned first or second driver based on the least significant bit of the aforementioned binary code. Thus, the aforementioned first and second drivers are driven according to the logical product obtained from the coincidence signal outputted from the aforementioned decoder and according to, for example, the complemented least significant bit of the corresponding binary-coded address signal.

With the aforementioned second semiconductor memory device, the memory addresses are arranged in gray code order. Thus, address signals which are inputted are treated as gray code instead of binary code. Next, the aforementioned address code conversion circuit converts the gray code to binary code. The operations of the aforementioned decoder and the first and second drivers are the same as in the aforementioned first semiconductor memory device.

BRIEF DESCRIPTION OF THE DRAWINGS

FIG. 2 is a diagram which shows the relationship between fuse blowing, gray code, and binary code in the embodiment shown in FIG. 1.

FIG. 4 is a diagram which illustrates the relationship between the gray code and the binary code in the embodiment shown in FIG. 3.

FIG. 5 is a diagram which explains the operation of repairing defects at two neighboring addresses using gray code.

DESCRIPTION OF PREFERRED EMBODIMENT

In the following, this invention will be explained in more detail with reference to embodiments thereof.

Embodiments of the semiconductor memory device of the present invention will be explained with reference to the figures.

Figure 1:
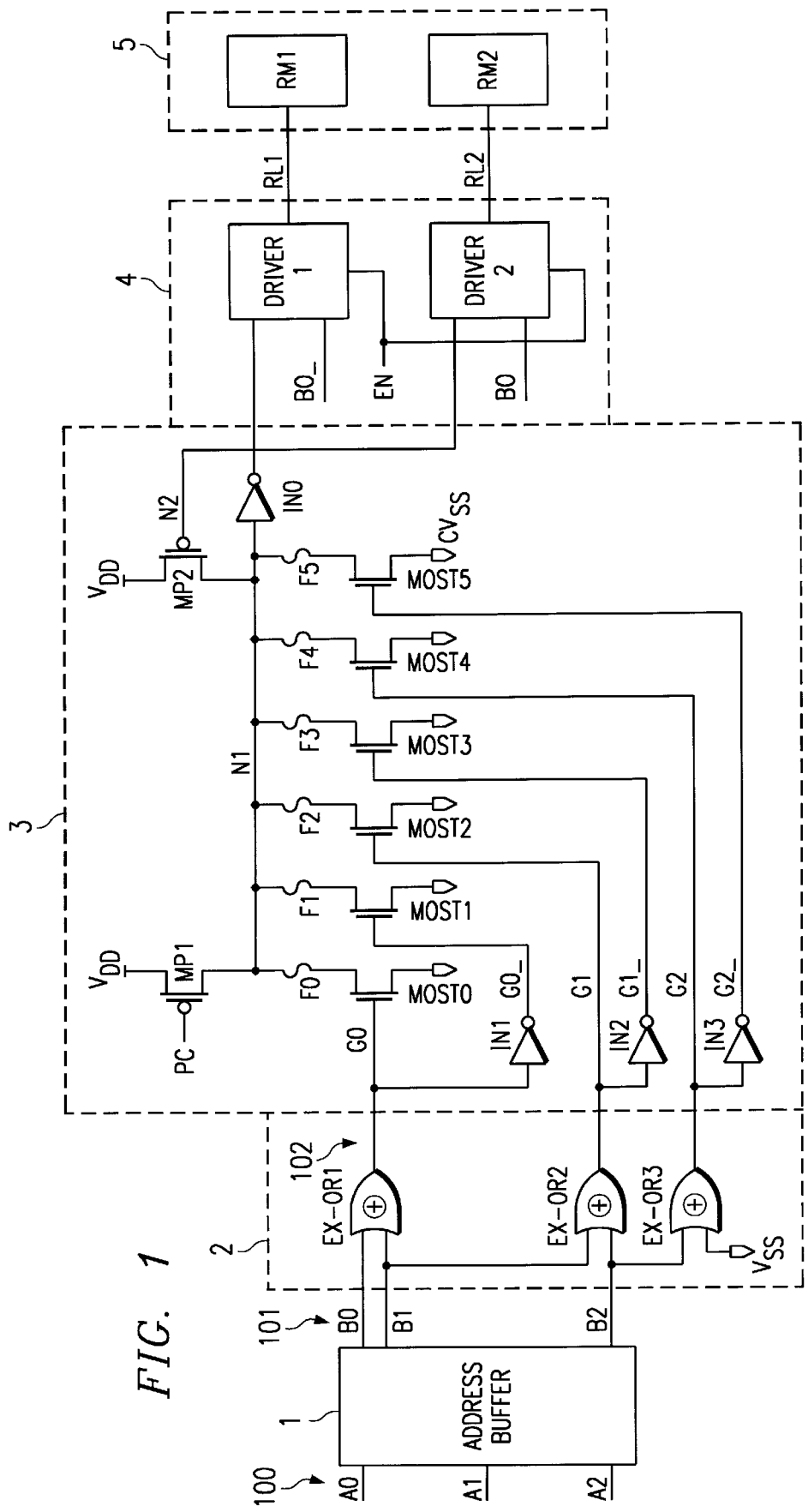
FIG. 1 is a diagram which shows the redundant circuit of an embodiment of the semiconductor memory device of the present invention.

FIG. 1 is a schematic diagram which shows the redundant circuit of the embodiment of the semiconductor memory device of the present invention. FIG. 2 is a diagram which shows the relationship between the blowing of fuses, gray code, and binary code in the embodiment example shown in FIG. 1. The aforementioned redundant circuit comprises the following: an address buffer (1), which latches the incoming binary-coded address signal; an address code conversion circuit (2) which converts the binary code (output from the address buffer (1)) to gray code and then outputs it; a redundant decoder (3) which comprises a NOR-type coincidence/un-coincidence discriminator circuit containing six fuses and used to set addresses at which defects occur;

a redundant line driver (4) which drives a redundant line; and a redundant memory (5) which is connected to the redundant line.

The latch circuit (not shown) of the aforementioned address buffer (1) latches the binary-coded address signal (100) inputted via A0–A2, then directly outputs it as a binary code (101) through B0–B2 to the address code conversion circuit (2). The address code conversion circuit (2) converts the input binary code (101) to a gray code (102) using exclusive-OR circuits (EXOR1–EXOR3). Next, it outputs the obtained gray code (102) through G0–G2 to the inverters (IN1–IN3) and the gates of n-type MOS transistors (MOST 0, 2, and 4) of the redundant decoder (3). The inverters (IN1–IN3) output the inverted signals of the gray code (102) through G0_–G2_ to the gates of n-type MOS transistors (MOST 1, 3, and 5). When the fuses (F0–F5) are blown in any combination, the redundant decoder (3) outputs a coincidence signal to the redundant line driver (4) in cases where a coincidence exists between the input gray code (102) and the address set in advance. When the redundant line driver (4) receives the coincidence signal as input, it drives the redundant lines (RL1) and (RL2), thereby activating the redundant memory (5).

The aforementioned structure will be explained in further detail below. In the address code conversion circuit (2), B0 and B1 are connected to the two input terminals of the exclusive-OR circuit (EXOR1). In addition, B1 and B2 are connected to the two input terminals of EXOR2. In addition, B2 and a ground Vss are connected to the two input terminals of EXOR3. With the above structure, the address code conversion circuit (2) converts a binary code (101), which is inputted from the address buffer (1) through B0–B2 into gray code (102). The output terminal of the exclusive-OR circuit (EXOR1) is connected to the gate of the n-type MOS transistor (MOST0) and the input terminal of the inverter (IN1). The output terminal of the exclusive-OR circuit (EXOR2) is connected to the gate of the n-type MOS transistor (MOST2) and the input terminal of the inverter (IN2). The output terminal of the exclusive-OR circuit (EXOR3) is connected to the gate of the n-type MOS transistor (MOST4) and the input terminal of the inverter (IN3). The output terminal of the inverter (IN1) is connected to the gate of the n-type MOS transistor (MOST1). The output terminal of the inverter (IN2) is connected to the gate of the n-type MOS transistor (MOST3). The output terminal of the inverter (IN3) is connected to the gate of the n-type MOS transistor (MOST5).

In the redundant decoder (3), each of the sources of the n-type MOS transistors (MOST0–MOST5) is connected to a control ground $CV_{SS}$, which changes from the high level to the low level (ground potential) after all address is transferred. The drains of the n-type MOS transistors (MOST0–MOST5) are connected to a node (N1) through fuses (F0)–(F5), respectively. The node (N1) is connected to the input terminal of the inverter (IN0) and the drains of p-type MOS transistors (MP1) and (MP2). The source of the p-type MOS transistor (MP1) is connected to a power source $V_{DD}$, and a precharge signal PC is inputted to its gate. The source of the p-type MOS transistor (MP2) is connected to the power source $V_{DD}$, and the output terminal of the inverter (IN0) is connected to its gate. The setting of addresses in the aforementioned redundant decoder (3) involves the blowing of three fuses when a defect occurs at a single address, and the blowing of four fuses when errors occur at two neighboring addresses.

In the redundant line driver (4), the output terminal of the inverter (IN0) is connected to one of the input terminals of a driver (DR1). B0_, which is the complement of B0, is connected to the other input terminal. The output terminal of the inverter (IN0) is connected to one of the input terminals of a driver (DR2). B0 is connected to the other input terminal. In addition, enable signals EN are inputted to the drivers (DR1) and (DR2). In the redundant memory (6), a redundant memory cell (RM1) is connected to a redundant line (RL1), which is connected to the driver (DR1). A redundant memory cell (RM2) is connected to a redundant line (RL2), which is connected to the driver (DR2). The drivers (DR1) and (DR2) of the redundant line driver (4) are activated to drive the redundant lines (RL1) and (RL2) when the two input terminals and the enable signals EN are all at the low level.

The operations of the redundant decoder (3) will be explained below.

The redundant circuit shown in FIG. 1 is activated according to a precharge cycle and an active cycle, adjusted to memory access operations. When the redundant circuit is activated, the redundant lines (RL1) and (RL2) are switched with the normal rows or columns to repair the defective memory cell. The following explanation pertains to cases in which the operation of defect repair via the redundant circuit is not carried out and to those in which it is.

When repair is not executed, the six fuses (F0)–(F5) of the redundant decoder (3) are all in an unblown state. First, during the precharge cycle, PC signals, applied to the gate of the MP1, are set at the low level in pulse form. When the MP1 is turned on, the node (N1) becomes high. During this process, since the node (N2) goes low, the MP2 is turned on, and the precharge signal PC goes high. Thus, even if the MP1 is turned off, the node (N1) will be maintained at the high level. When the node (N1) is high, the redundant circuit is in the active state. During the precharge cycle, however, the redundant circuit is not activated since the enable signal EN sets the redundant line driver (4) to the inactive state.

Next, when the active cycle begins, the binary code (101), based on the address signal (100), is inputted to the address code conversion circuit (2). The gray code (102) into which the aforementioned binary code (101) was converted and the complemented signal of the aforementioned gray code (102) are inputted to the gates of MOST0–MOST5. Since none of the fuses (F0–F5) are blown, any one of the MOST0–MOST5 may be turned on to discharge the node (N1) and set it at the low level. When the node (N2) goes high, MP2 is turned off, thereby maintaining the node (N1) at the low level.

Thus, the node (N2) is maintained at the high level. As a result, the redundant line driver (4) will not be activated, even if a low level enable signal EN is input to the redundant line driver (4). Thus, the redundant circuit remains inactive.

In cases of repair of a defect at an address the fuse corresponding to that particular address is blown. FIG. 2(A) shows the operation of fuse blowing for the case of repair of a defect at a single address. FIG. 2(B) shows the operation of fuse blowing for the case of repair of defects at two neighboring addresses. As FIG. 2 makes clear, for the single address case, three fuses are blown, and for the case of two neighboring addresses, four fuses are blown. For example, as shown in Ref 1, for the defect repair at "0, 1, 0," the fuses (F0), (F2), and (F5) are blown. As shown in Ref 2, for the defect repair at two neighboring addresses, "0, 1, 0" and "0, 1, 1," the fuses (F0), (F1), (F2), and (F5) are blown. In Ref 2, the program is designed to blow the fuses in which B1 is ignored. The process of defect repair will be discussed below for these two cases.

In the precharge cycle, in the case of both Ref 1 and Ref 2, the redundant circuit remains in the inactive state, in the same manner as the aforementioned case in which defect repair is not performed, i.e., the case in which none of the fuses (F0)–(F5) is blown.

Next, when the active cycle begins, the binary code (101), based on the address signal (100), is inputted to the address code conversion circuit (2). Next, the gates of the MOST0–MOST5 in the redundant decoder (3) receive as input the aforementioned gray code (102) (obtained by converting the aforementioned binary code (101)), and the complemented signal of the aforementioned gray code (102).

In the case of Ref 1, when the fuses (F0), (F2), and (F5) are blown, it is determined whether the input gray code (102) coincides with the programmed address. Specifically, if an address other than "0, 1, 0" is inputted, one of the group consisting of MOST1, MOST3, and MOST4 is turned on, thereby setting the node (N1) to the low level. As a result, the redundant line driver (4) is not activated, and the redundant circuit remains inactive.

In contrast, if, when the fuses (F0), (F2), and (F5) are blown, it is determined that the input gray code (102) coincides with the programmed address (i.e., if the address "0, 1, 0" is inputted), then no member of the group consisting of MOST1, MOST3, and MOST4 is turned on. As a result, the node (N1) remains at the high level. Under this condition, since B0__ is connected to the other input terminal of the driver (DR1), and B0 is connected to the other input terminal of the driver (DR2), the aforementioned drivers (DR1) and (DR2) are in the low-active state. Thus, when the enable signal EN goes low, since B0 is low, the driver (DR2) drives the redundant line (RL2), thereby activating the redundant memory cell (RM2). As a result, the defect at address "0, 1, 0," is repaired. In addition, since B0__ is at the high level, the driver (DR1) does not drive the redundant line (RL1). Under the above operations, the normal rows or normal columns of the address "0, 1, 0" in which a defect occurred are replaced by the redundant line (RL2), thereby making it possible to repair the defective memory cell.

In the case of Ref 2, when the fuses (F0), (F1), (F2), and (F5) are blown, it is determined whether a coincidence exists between the input gray code (102) and the programmed addresses. Specifically, if addresses other than "0, 1, 0" and "0, 1, 1" are inputted, either (MOST3) or (MOST4) is turned on, thereby setting the node (N1) to the low level. As a result, the redundant line driver (4) is not activated, and the redundant circuit remains inactive. In contrast, if, when the fuses (F0), (F1), (F2), and (F5) are blown, it is determined that the input gray code (102) coincides with the programmed addresses (i.e., if the address "0, 1, 0" or "0, 1, 1" is inputted), then neither the MOST3 nor the MOST4 is turned on. As a result, the node (N1) remains at the high level.

Under this condition, assuming that "0, 1, 0" is inputted, when the enable signal EN goes low, since B0 is low, the driver (DR2) drives the redundant line (RL2), thereby activating the redundant memory cell (RM2). As a result, the address "0, 1, 0," in which a defect occurred, is repaired. During this process, since B0__ is high, the driver (DR1) does not drive the redundant line (RL1).

If, on the other hand, the input address is "0, 1, 1," since B0__ is low, the driver (DR1) drives the redundant line (RL1), thereby activating the redundant memory cell (RM1). As a result, the address "0, 1, 1," in which a defect occurred, is repaired. During this process, since B0 is high, the driver (DR2) does not drive the redundant line (RL2).

Under the above operations, the normal rows or normal columns of the address "0, 1, 0" or "0, 1, 1," at which a defect occurred, are replaced by the redundant line (RL2) or (RL1), thereby making it possible to repair the defective memory cell. In this manner, with the present embodiment, it is possible to repair one or two neighboring addresses using a single redundant decoder (3). For this reason, it is possible to reduce the number of fuses, and also to reduce the proportion of chip area occupied by the redundant circuit.

As described above, with the redundant decoder (3), if a defect occurs at a single address, three fuses are blown, and if defects occur at two neighboring addresses, four fuses are blown. Thus, the fuses are blown only when certain addresses are inputted, with the result that the redundant circuit remains active, while the node (N1) cannot be discharged by the cut-off MOS transistors connected to node (N1). As FIG. 2 makes clear, it is thus possible to use a single decoder to repair one or two neighboring memory cells by decoding addresses converted to gray code.

Figure 3:
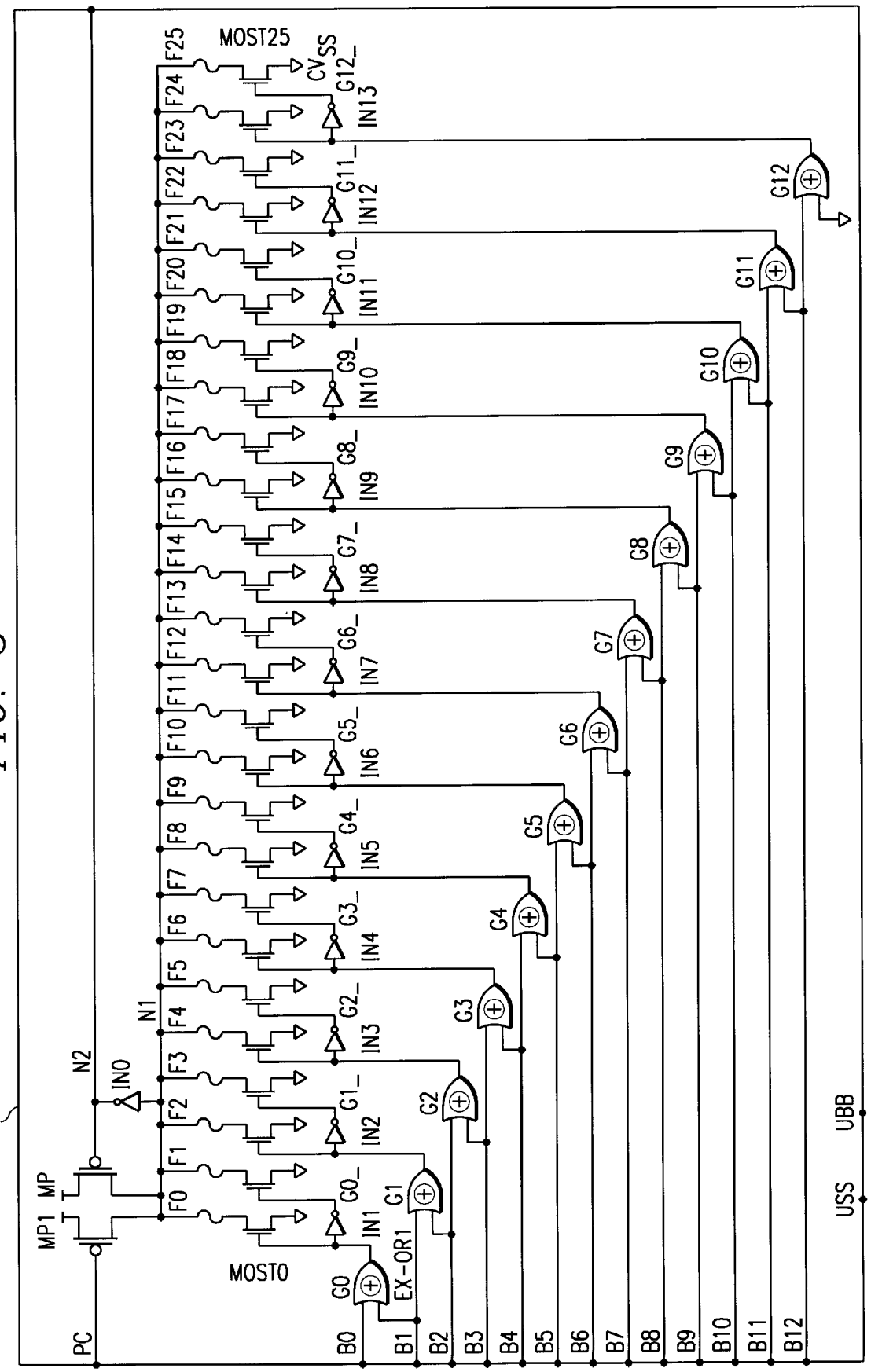
FIG. 3 is a diagram which shows a redundant decoder comprising an address code conversion circuit for a redundant circuit, pertaining to another embodiment of the semiconductor memory device of the present invention.

FIG. 3 is a diagram which shows a redundant decoder comprising an address code conversion circuit for a redundant circuit, pertaining to another embodiment of the semiconductor memory device of the present invention. FIG. 4 is a diagram which illustrates the relationship between the gray code and the binary code in the embodiment shown in FIG. 3.

The aforementioned redundant decoder (6) comprises the following: 13 exclusive-OR circuits (EXOR1–EXOR13); 14 inverters (IN0–IN13); 26 n-type MOS transistors (MOST0–MOST25); 26 fuses (F0–F25); and 2 p-type MOS transistors (MP1) and (MP2). The system is designed to handle 13 bit binary-coded addresses. In addition, it is a circuit which combines the address code conversion circuit (2) and the redundant decoder (3) in the embodiment shown in FIG. 1. In addition, in the same manner as in the embodiment shown in FIG. 1, a redundant circuit is formed which is connected to a redundant line driver (4) and a redundant memory (5).

The exclusive-OR circuits (EXOR1–EXOR13) convert 13 bit binary-coded address signals B0–B12 into 13 bit gray-coded signals G0–G12. The inverters (IN1–IN13) generate complemented signals G0__–G12__, which correspond to the aforementioned gray codes G0–G12. A NOR-type coincidence/un-coincidence discriminator circuit is composed of the inverter (IN0), (MP1) and MP2, MOST0–MOST25, and fuses (F0–F25). The basic operations of the redundant decoder (6) are the same as those of the address conversion circuit (2) and the redundant decoder (3) shown in FIG. 1. The only difference is that the number of binary code (and gray code) bits is increased from 3 bits to 13 bits.

In actual semiconductor memory devices, a suitable number of the aforementioned redundant circuits is used.

FIGS. 5(A) and (B) are diagrams used to explain the operation of repairing defects at two neighboring addresses using gray code with the aforementioned redundant circuit. FIG. 5(A) shows an example of binary code. In order to repair defects at two neighboring addresses at B0, it is necessary to repair the areas A–E. During this process, when repairing defects at neighboring addresses, if the B0 digit is ignored, it is possible to repair 50% of the defects at two neighboring addresses. In addition, if the exclusive-OR of B0 and B1 is obtained, it is possible to repair 75% of the defects at two neighboring addresses. However, in repairing defects at two neighboring addresses in binary code, the structure of the logic circuit and the fuse blowing program are made more complex. In the above embodiment, a circuit which converts the aforementioned binary code to gray code makes it possible to reliably repair defects at two neighboring addresses (a–p) at all times.

Specifically, with gray code, since the values of two neighboring numbers are always simply inverted by exactly one bit, it is possible to repair defects at the two neighboring addresses using a single redundant decoder by running a fuse blowing program in the redundant decoder so as to allow the redundant decoder to operate whether the aforementioned single bit is 1 or 0, then selecting two redundant drivers connected to the aforementioned redundant decoder according to the aforementioned single bit.

Thus, with the redundant decoder of the present invention, in repairing a defect at a single address, a fuse blowing program is run so as to allow activation only at the corresponding address. When defects at two neighboring addresses are to be corrected, a fuse blowing program is run in which bits having different values in the aforementioned two addresses are ignored, so as to allow for operation at either one of the aforementioned two neighboring addresses.

Figure 6:
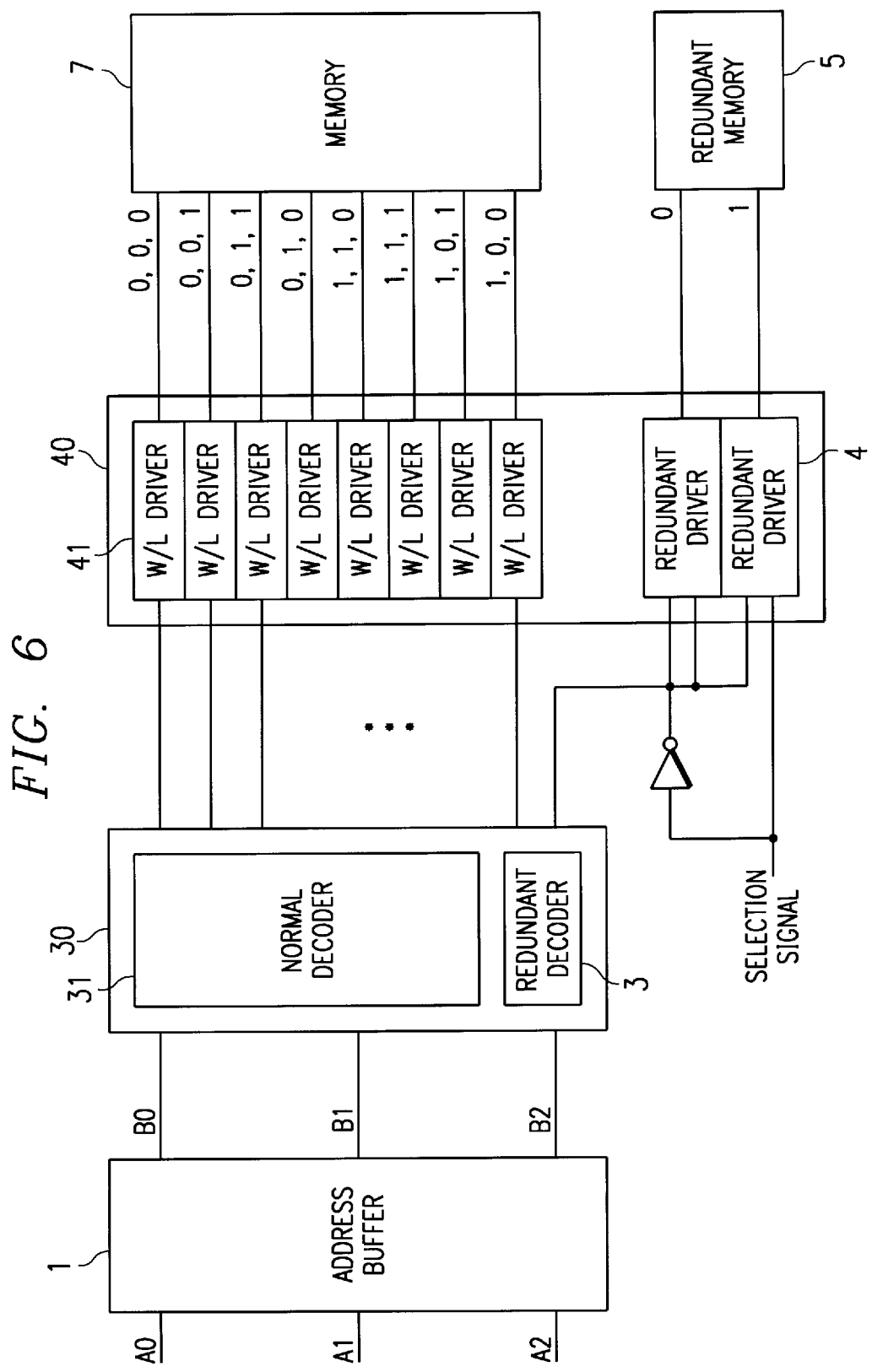
FIG. 6 is a diagram which shows the redundant circuit of yet another embodiment of the semiconductor memory device of the present invention.

FIG. 6 is a figure which shows the redundant circuit of yet another embodiment of the semiconductor memory device of the present invention. Unlike the redundant circuit shown in FIG. 1, with the present redundant circuit, the normal memory address array is set in gray code order in order to achieve the same effects as in FIG. 1 in relation to repairing defects at two neighboring addresses using a single redundant decoder. In the present embodiment, components which are the same as in FIG. 1 are denoted by the same numbers, and not explained in detail here.

The decoder (30) comprises a normal decoder (31) (not shown in FIG. 1) and a redundant decoder (3). A driver circuit (40) comprises a word line driver (41) (not shown in FIG. 1) and a redundant line driver (4).

In cases where a defect at an address is not to be repaired, the redundant decoder (3) is not activated. Rather, a single word line driver (41), corresponding to the address input by the normal decoder (31), is driven to activate the normal memory (7).

In contrast, in cases where defects at addresses are to be repaired, the normal decoder (31) is not activated. Rather, a single redundant line driver (4), corresponding to a program previously set by the redundant decoder (3), is driven to activate the redundant memory (5). During this process, the normal decoder (31) does not operate because it is set in the inactive state by the redundant decoder (3). In addition, one of the two redundant drivers (4) is selected according to a selection signal. In the same manner as in the embodiment shown in FIG. 1, a single redundant decoder (3) is used to repair defects at two neighboring addresses.

During this process, the redundant decoder (3) treats the incoming binary code as gray code. In addition, the process of fuse blowing is the same as in the embodiment shown in FIG. 1. In addition, when the incoming address signal is in gray code, the selection signal will correspond to the least significant bit of the gray code converted to binary code.

Figure 7:
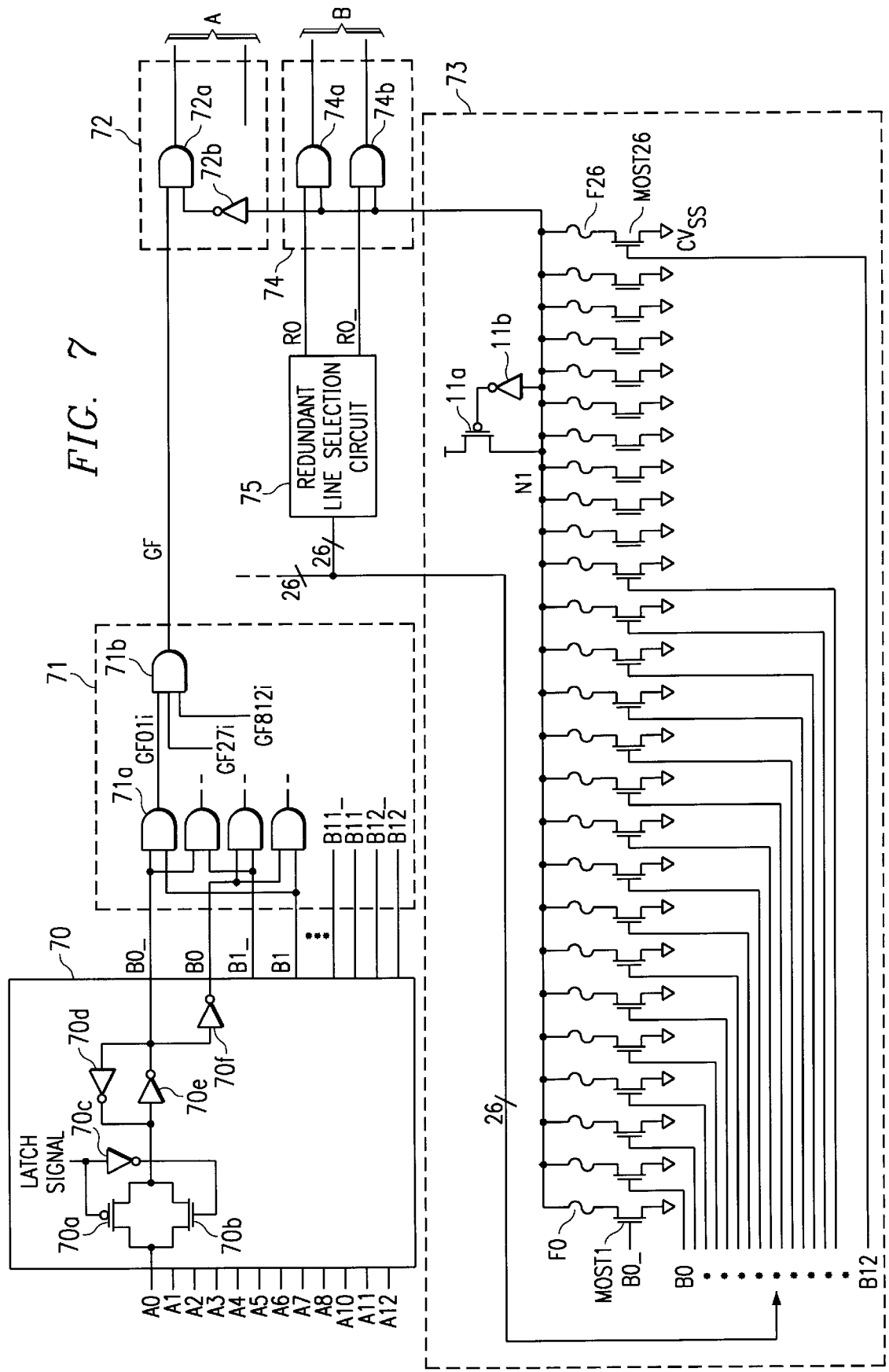
FIG. 7 is a diagram which shows the redundant circuit of yet another embodiment of the semiconductor memory device of the present invention.
Figure 8:
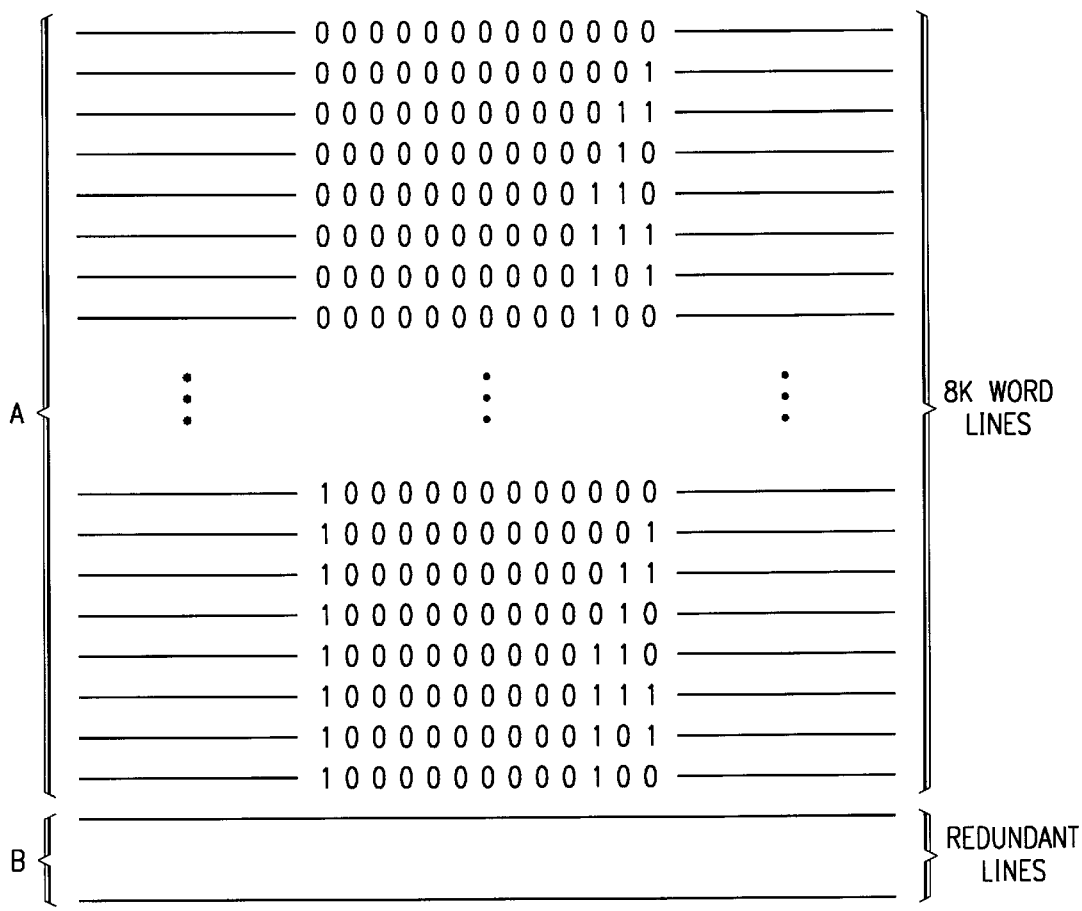
FIG. 8 is a diagram which shows the address assignment of the memory shown in FIG. 7.
Figure 9:
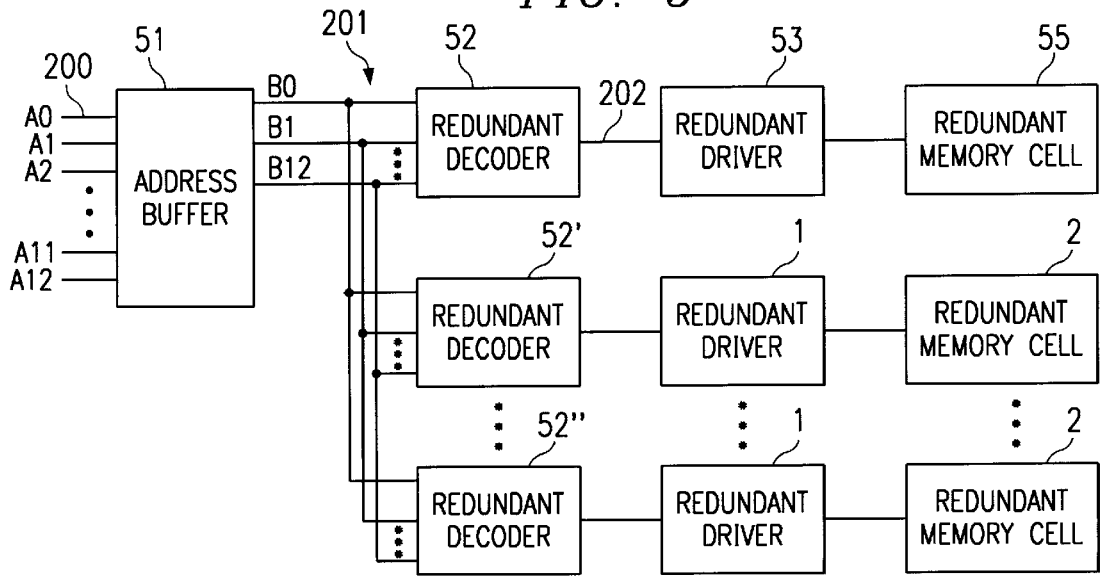
FIG. 9 is a schematic diagram which shows the structure of a redundant circuit in a conventional semiconductor memory device.

FIG. 7 is a diagram which shows the redundant circuit of yet another embodiment of the semiconductor memory device of the present invention. In the same manner as the redundant circuit shown in FIG. 6, in the present embodiment, the normal memory address array is set in gray code order, in order to achieve the same effects as in FIG. 1 in relation to repairing defects at two neighboring addresses using a single redundant decoder. FIG. 8 is a diagram which shows the address assignment of the memory shown in FIG. 7.

In an address buffer (70), the A0 latch circuit comprises the following: a p-type MOS transistor (70a), an n-type MOS transistor (70b), and inverters (70c), (70d), (70e), and (70f). When a latch signal is inputted to the inverter (70c), the transistors (70a) and (70b) are turned on or off, thereby latching the signals input from A0. A signal B0, corresponding directly to A0, and a signal B0__, which is the complement of A0, are outputted. In addition, the latch circuits of A1–A12 also have the same structure. A normal decoder (71) comprises a number of logic product circuits (71a) and (71b). The input terminal of the logic product circuit (71a) receives, for example, B0__ and B1. Its output terminal outputs a previous decoding address signal GF01i. The input terminal of the logic product circuit (71b) receives the previous decoding address signals GF01i, GF27i, and GF812i. Its output terminal outputs the previous coding address signal GF. One of the drivers of the word line driver (72) is composed of a logic product circuit (72a) and an inverter (72b). It outputs the logical product obtained from the previous decoding address signal GF outputted from the logic product circuit (71b), and the complemented signal of the output of the redundant decoder (73).

In the same manner as the normal decoder (71), the redundant decoder (73) inputs B0–B12 and B0__–B12__, which are outputted from the address buffer (70). The aforementioned B0–B12 and B0__–B12__ are connected to the gates of the corresponding n-type MOS transistors (MOST1–26). The aforementioned n-type MOS transistors (MOST1–26) are connected through the fuses (F0)–(F25) to the node (N1). The logical value of the aforementioned node (N1) becomes the output signal of the redundant decoder (73). When the node (N1) is at the low level, the word line driver (72) is in the active state. When the node (N1) is at the high level, the redundant line driver (74) enters the active state. The redundant line selection circuit (75) inputs B0–B12 and B0__–B12__, which comprise signals of 26 bits. The incoming B0–B12 are treated as gray code, which gray code (B0–B12) is converted to binary code. Next, the least significant bit R0 and the R0 complemented signal R0__ are outputted. The aforementioned two signals R0 and R0__ are used in selecting between the two redundant lines, i.e., selecting one of the redundant line drivers.

The word line driver (72) is only described here in terms of a circuit pertaining to a single word line. However, in actual use, it has a circuit structure with a number of word lines corresponding to 8K, as shown in FIG. 8. When the normal decoder (71) operates with respect to four word lines, the circuit structure will consist of 2K for 8K of word lines. The logical product circuits (74a) and (74b), which form the redundant line driver (74), activate one of the redundant lines shown in FIG. 8, based on the logical product output obtained from the signal outputted from the redundant decoder (73), and R0 and R0__, which are outputted from the redundant line selection circuit (75).

In the above embodiment, the binary code address is inputted directly to the redundant decoder without being converted to gray code. However, as shown in FIG. 8A, it is also possible to repair defects at two neighboring addresses using a single redundant decoder by setting the normal memory address array in gray code order. It should be noted that the redundant decoder (73) treats the incoming binary code as gray code. The process of fuse blowing is the same as in the embodiment shown in FIG. 3.

As described above, with the present invention, it is possible to easily increase the integration level and increase the memory capacity of a semiconductor memory device by using a single redundant decoder to completely repair defects at one or two neighboring addresses, thereby improving the efficiency of the repair process.

I claim:

1. A semiconductor memory device with a redundant circuit for repairing defective memory cells which comprises:

an address code conversion circuit which converts a binary-coded address signal into gray code;

a decoder, in which addresses of one or two neighboring memory cells, in which defects have occurred, are set, wherein said decoder outputs a coincidence signal after determining whether said set addresses coincide or do not coincide with said gray code output from said address code conversion circuit;

a first driver, into which said coincidence signal and a least significant bit of said binary-coded address signal are input, wherein said first driver drives a first redundant line which is connected to a redundant memory cell; and a second driver, into which said coincidence signal and a complemented signal of said least significant bit of said binary-coded address signal are input, wherein said second driver drives a second redundant line which is connected to a redundant memory cell.

2. The device of claim 1, wherein said set addresses are set in advance by blowing fuses in said decoder.

3. The device of claim 1, wherein said redundant circuit further comprises an address buffer which outputs said binary-coded address signal to said decoder.

4. The device of claim 3, wherein said address buffer further comprises a latch circuit.

5. A semiconductor memory device comprising:

a normal memory addresses array set in gray code order;

a redundant circuit for repairing defective memory cells which comprises:

a decoder, in which addresses of one or two neighboring memory cells, in which defects have occurred, are set, wherein said decoder outputs a coincidence signal after determining whether said set addresses coincide or do not coincide with an input address signal;

an address code conversion circuit which converts said input address signal from gray code into a binary-coded address signal;

a first driver, into which said coincidence signal and a least significant bit of said binary-coded address signal are input wherein said first driver drives a first redundant line which is connected to a redundant memory cell; and a second driver, into which said coincidence signal and a complemented signal of said least significant bit of said binary-coded address signal are input, wherein said second driver drives a second redundant line which is connected to a redundant memory cell.

6. The device of claim 5, wherein said decoder comprises a normal decoder and a redundant decoder wherein if a defect is not to be repaired said normal decoder is activated which is turn activates a normal memory cell and if a defect is to be repaired said redundant decoder is activated which in turn activates either said first redundant line or said second redundant line.

7. The device of claim 5, wherein said set addresses are set in advance by blowing fuses in said decoder.

8. The device of claim 5, wherein said redundant circuit further comprises an address buffer which outputs said binary-coded address signal to said decoder.

9. The device of claim 8, wherein said address buffer further comprises a latch circuit.

* * * * *